US012805092B2

(12) United States Patent
Kim et al.

(10) Patent No.: US 12,805,092 B2
(45) Date of Patent: Nov. 17, 2026

(54) LIGHT EMITTING DEVICE AND DISPLAY APPARATUS COMPRISING THE SAME

(71) Applicant: LG Display Co., Ltd., Seoul (KR)

(72) Inventors: Il-Soo Kim, Goyang-si (KR); Yongseok Kwak, Paju-si (KR); Myungsoo Han, Goyang-si (KR); Hyowon Kwon, Suwon-si (KR)

(73) Assignee: LG DISPLAY CO., LTD., Seoul (KR)

( * ) Notice: Subject to any disclaimer, the term of this patent is extended or adjusted under 35 U.S.C. 154(b) by 530 days.

(21) Appl. No.: 18/474,912

(22) Filed: Sep. 26, 2023

(65) Prior Publication Data

US 2024/0178266 A1 May 30, 2024

(30) Foreign Application Priority Data

Nov. 24, 2022 (KR) ........................ 10-2022-0159063

(51) Int. Cl.
*H10H 29/10* (2025.01)
*H10W 90/00* (2026.01)

(52) U.S. Cl.
CPC ............ *H10H 29/10* (2025.01); *H10W 90/00* (2026.01)

(58) Field of Classification Search
CPC ........ H10H 29/10; H10H 29/30; H10H 29/14; H10H 29/8323; H10H 29/24; H10H 29/962; H10H 20/813; H10H 29/142; H10H 20/8314; H10H 20/857; H10H 20/825; H10H 20/831; H10H 20/833; H10H 20/84; H01L 25/167; H01L 25/0753; H10D 86/441; H10D 86/451
See application file for complete search history.

(56) References Cited

U.S. PATENT DOCUMENTS

| | | | | |
|---|---|---|---|---|
| 10,154,626 | B2 * | 12/2018 | Lin | A01G 7/045 |
| 10,386,977 | B2 * | 8/2019 | No | G06F 21/32 |
| 12,100,696 | B2 * | 9/2024 | Chae | H10H 20/018 |
| 12,446,361 | B2 * | 10/2025 | Abe | H10H 20/812 |
| 2018/0172761 | A1 | 6/2018 | Van Beers et al. | |
| 2019/0172760 | A1 | 6/2019 | Hsiang et al. | |
| 2020/0402964 | A1 | 12/2020 | Kim | |
| 2021/0050482 | A1 * | 2/2021 | Breva | H10H 20/8312 |
| 2021/0091256 | A1 * | 3/2021 | Jang | H10H 20/813 |
| 2022/0085239 | A1 | 3/2022 | Kim et al. | |
| 2022/0158033 | A1 * | 5/2022 | Nishiyama | H10H 20/0137 |
| 2022/0181381 | A1 | 6/2022 | Lee et al. | |

FOREIGN PATENT DOCUMENTS

| | | | |
|---|---|---|---|
| CN | 114597294 | A | 6/2022 |
| JP | 2009-152240 | A | 7/2009 |
| KR | 10-2021-0083680 | A | 7/2021 |
| TW | 201208114 | A1 | 2/2012 |

* cited by examiner

*Primary Examiner* — Steven H Loke
*Assistant Examiner* — Khatib A Rahman
(74) *Attorney, Agent, or Firm* — Birch, Stewart, Kolasch & Birch, LLP

(57) ABSTRACT

According to an aspect of the present disclosure, a light emitting device and a display apparatus including the same are discussed. The light emitting device can include an n-type electrode, a first n-type layer disposed on the n-type electrode, a first active layer disposed on the first n-type layer, a first p-type layer disposed on the first active layer, a p-type electrode disposed on the first p-type layer, a second p-type layer disposed on a partial area of the p-type electrode, a second active layer disposed on the second p-type layer, and a second n-type layer disposed on the second active layer.

21 Claims, 11 Drawing Sheets

LIGHT EMITTING DEVICE AND DISPLAY APPARATUS COMPRISING THE SAME

CROSS-REFERENCE TO RELATED APPLICATIONS

This application claims priority to Korean Patent Application No. 10-2022-0159063 filed on Nov. 24, 2022, in the Republic of Korea, the entire contents of which are hereby expressly incorporated by reference into the present application.

BACKGROUND

Field

The present disclosure relates to a light emitting device and a display apparatus including the same, and more particularly, to a light emitting device with an improved usage yield and a display apparatus in which a space for disposing a redundancy light emitting device is minimized.

Discussion of the Related Art

Currently, as the world enters a full-scale information era, a field of a display device which visually expresses electrical information signals has been rapidly developing. Studies are continued to improve performances of various display devices such as a thin-thickness, a light weight, and low power consumption.

Among various display apparatus, a light emitting display apparatus is a self-emitting display apparatus so that a separate light source is not necessary, which is different from a liquid crystal display apparatus. Therefore, the light emitting display apparatus can be manufactured to have a light weight and a small thickness.

Further, since the light emitting display apparatus is driven at a low voltage, it is advantageous not only in terms of power consumption, but also in terms of color implementation, a response speed, a viewing angle, and a contrast ratio (CR). Therefore, it is expected to be utilized in various fields.

SUMMARY OF THE DISCLOSURE

An object to be achieved by one or more embodiments of the present disclosure is to provide a light emitting device which reduces a manufacturing cost by improving a usage yield.

Another object to be achieved by one or more embodiments of the present disclosure is to provide a display apparatus in which one light emitting device includes two active layers to minimize or reduce a space for disposing a redundancy light emitting device.

Still another object to be achieved by one or more embodiments of the present disclosure is to provide a display apparatus in which a placement space of a redundancy light emitting device is minimized or reduced to implement high resolution.

Another object to be achieved by one or more embodiments of the present disclosure is to provide a display apparatus which is applied to a transparent display apparatus to implement a high transmittance.

Another object to be achieved by one or more embodiments of the present disclosure is to provide a display apparatus which easily repairs a defective light emitting device.

Another object to be achieved by one or more embodiments of the present disclosure is to provide a display apparatus which selectively implements a low luminance mode and a high luminance mode.

Another object to be achieved by one or more embodiments of the present disclosure is to provide a display apparatus which improves a heat generation characteristic and a life-span reliability.

Objects of the present disclosure are not limited to the above-mentioned objects, and other objects, which are not mentioned above, can be clearly understood by those skilled in the art from the following descriptions.

According to an aspect of the present disclosure, a light emitting device includes a first n-type electrode, a first n-type layer disposed on the first n-type electrode, a first active layer disposed on the first n-type layer, a first p-type layer disposed on the first active layer, a p-type electrode disposed on the first p-type layer, a second p-type layer disposed on a partial area of the p-type electrode, a second active layer disposed on the second p-type layer, and a second n-type layer disposed on the second active layer.

According to another aspect of the present disclosure, a display apparatus includes a substrate in which a plurality of pixels including a plurality of sub pixels are defined, a first transistor disposed in each of the plurality of sub pixels on the substrate, a planarization layer disposed on the first transistor, a first individual electrode disposed on the planarization layer and connected to the first transistor, a light emitting device disposed on the first individual electrode, a second individual electrode and a common electrode disposed on the planarization layer, a first connection electrode connecting the common electrode and the p-type electrode of the light emitting device, and a second connection electrode connecting the second individual electrode and the second n-type layer of the light emitting device.

Other detailed matters of the embodiments of the present disclosure are included in the detailed description and the drawings.

According to one or more embodiments of the present disclosure, a light emitting device in which two emission units manufactured by separate processes are laminated is configured to improve a usage yield of a light emitting device by a mixture effect of wavelengths of light emitted from two emission units.

According to one or more embodiments of the present disclosure, one light emitting device is configured with a structure in which a main emission unit and a redundancy emission unit are laminated to minimize or reduce a space for placing a redundancy light emitting device.

According to one or more embodiments of the present disclosure, a space for placing a redundancy light emitting device is minimized or reduced to implement a display apparatus with a high resolution and a high transmittance.

According to one or more embodiments of the present disclosure, two emission units included in one light emitting device are configured to selectively emit light so that when one emission unit is defective, the display apparatus can be driven by the other one emission unit.

According to one or more embodiments of the present disclosure, two emission units included in one light emitting device are configured to selectively emit light so that a low luminance mode and a high luminance mode can be selectively implemented.

According to one or more embodiments of the present disclosure, two emission units included in one light emitting device are configured to emit light with the same transistor to provide a display apparatus with a low power by reducing a current density of the light emitting device and improving a heat generation property and a life-span reliability of the light emitting device.

The effects according to the present disclosure are not limited to the contents exemplified above, and more various effects are included in the present specification.

BRIEF DESCRIPTION OF THE DRAWINGS

The above and other aspects, features and other advantages of the present disclosure will be more clearly understood from the following detailed description taken in conjunction with the accompanying drawings, in which.

DETAILED DESCRIPTION OF THE EMBODIMENTS

Figure 1A:
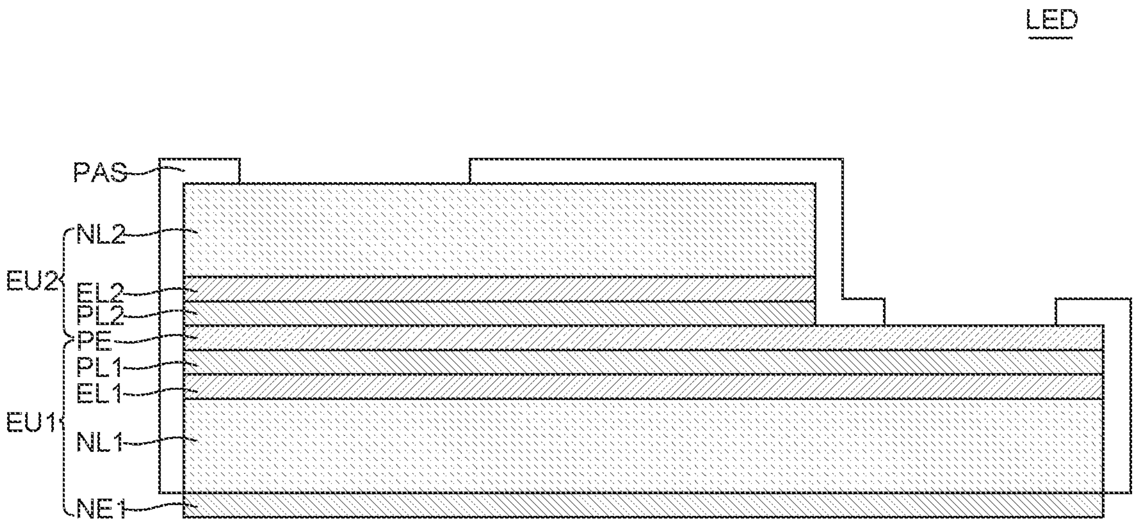
FIG. 1A is a cross-sectional view of a light emitting device according to an embodiment of the present disclosure.

Advantages and characteristics of the present disclosure and method(s) of achieving the advantages and characteristics will be clear by referring to embodiments described below in detail together with the accompanying drawings. However, the present disclosure is not limited to the embodiments disclosed herein but will be implemented in various forms. The embodiments are provided by way of example only so that those skilled in the art can fully understand the disclosures of the present disclosure and the scope of the present disclosure.

The shapes, sizes, ratios, angles, numbers, and the like illustrated in the accompanying drawings for describing the embodiments of the present disclosure are merely examples, and the present disclosure is not limited thereto. Like reference numerals generally denote like elements throughout the specification. Further, in the following description of the present disclosure, a detailed explanation of known related technologies can be omitted to avoid unnecessarily obscuring the subject matter of the present disclosure.

The terms such as 'including,' 'having,' 'comprising,' etc. used herein are generally intended to allow other components to be added unless the terms are used with the term 'only'. Any references to singular can include plural unless expressly stated otherwise.

Components are interpreted to include an ordinary error range even if not expressly stated.

When the position relation between two parts is described using the terms such as 'on', 'over', 'above', 'below', 'next', one or more parts can be positioned between the two parts unless the terms are used with the term 'immediately' or 'directly'.

When an element or layer is disposed "on" or "over" another element or layer, one or more additional layers or elements can be interposed directly on the other element or layer or therebetween.

Although the terms "first", "second", and the like are used for describing various components, these components are not confined by these terms. These terms are merely used for distinguishing one component from the other components and may not define order or sequence. Therefore, a first component to be mentioned below can be a second component in a technical concept of the present disclosure.

Like reference numerals generally denote like elements throughout the specification.

A size and a thickness of each component illustrated in the drawing are illustrated for convenience of description, and the present disclosure is not limited to the size and the thickness of the component illustrated.

The features of various embodiments of the present disclosure can be partially or entirely adhered to and/tr1 or combined with each other and can be interlocked and operated in technically various ways, and the embodiments can be carried out independently of or in association with each other.

Hereinafter, various embodiments of the present disclosure will be described in detail with reference to accompanying drawings. All the components of each light emitting device and each display apparatus according to all embodiments of the present disclosure are operatively coupled and configured.

Figure 1B:
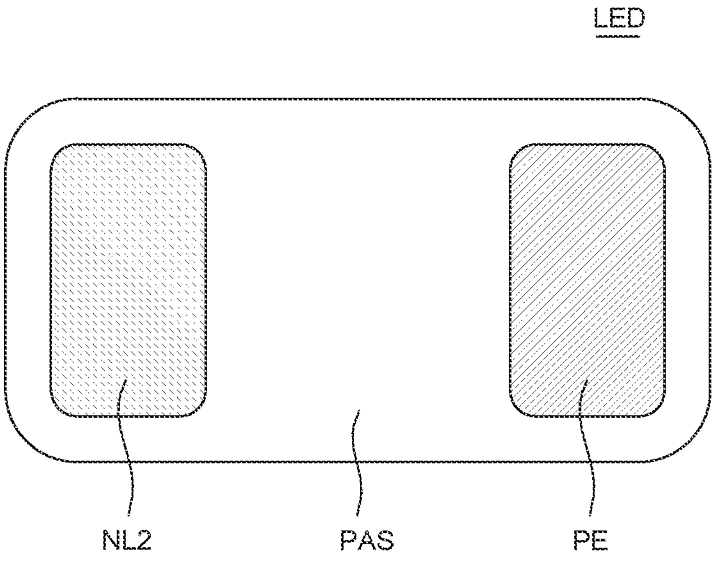
FIG. 1B is a plan view of a light emitting device according to an embodiment of the present disclosure.

FIG. 1A is a cross-sectional view of a light emitting device according to an embodiment of the present disclosure. FIG. 1B is a plan view of a light emitting device according to an embodiment of the present disclosure. Various display apparatuses/devices can utilize and include one or more of the light emitting device of FIGS. 1A and 1B.

Referring to FIGS. 1A and 1B, a light emitting device LED according to an embodiment of the present disclosure includes a first emission unit EU1, a second emission unit EU2, and a passivation layer PAS.

The first emission unit EU1 includes a first n-type electrode NE1, a first n-type layer NL1, a first active layer EL1, a first p-type layer PL1, and a p-type electrode PE. In the present disclosure, the first n-type electrode NE1 can also be referred to as an n-type electrode NE1.

The first n-type electrode NE1 is a layer disposed to inject electrons into the first active layer EL1 through the first n-type layer NL1. Further, the first n-type electrode NE1 can also serve as a bonding metal to bond a first individual electrode of a display device (to be described below) and the light emitting device LED. The first n-type electrode NE1 can be configured by a single layer or a plurality of layers formed of at least one of nickel (Ni), gold (Au), platinum (Pt), titanium (Ti), aluminum (Al), and chrome (Cr), but is not limited thereto.

The first n-type layer NL1 is disposed on the first n-type electrode NE1. The first n-type layer NL1 is a layer for supplying electrons to the first active layer EL1. For example, the first n-type layer NL1 can be formed by doping an n-type impurity, such as silicon (Si), on a gallium nitride (GaN) semiconductor layer formed by growing a gallium nitride (GaN) layer, but is not limited thereto.

The first active layer EL1 is disposed on the first n-type layer NL1. The first active layer EL1 is layer in which electrons and holes are coupled to emit light. For example, the first active layer EL1 can have a multi-quantum well structure in which a plurality of barrier layers and well layers are alternately disposed, the well layer is configured by an indium gallium nitride (InGaN) layer, and the barrier layer is configured by gallium nitride (GaN), but is not limited thereto.

The first p-type layer PL1 is disposed on the first active layer EL1. The first P-type layer PL1 is a layer for supplying holes to the first active layer EL1. For example, the first p-type layer PL1 is formed by doping a p-type impurity, such as magnesium (Mg), zinc (Zn), and beryllium (Be), on a gallium nitride (GaN) semiconductor layer formed by growing a gallium nitride (GaN) layer, but is not limited thereto.

The p-type electrode PE is disposed on the first p-type layer PL1. The p-type electrode PE can inject the holes into the first active layer EL1 through the first p-type layer PL1. At this time, the p-type electrode PE can be formed of a conductive material having transparency so as to allow light emitted from the first active layer EL1 to upwardly pass. For example, the p-type electrode PE can be a transparent electrode. For example, the p-type electrode PE can be formed of transparent conductive oxide and can be formed of indium tin oxide (ITO) or indium zinc oxide (IZO), but is not limited thereto.

The first emission unit EU1 can emit light as exciton disappears in the first active layer EL1. For example, when a voltage is applied to each of the first n-type electrode NE1 and the p-type electrode PE of the first emission unit EU1, electrons and holes are injected from the first n-type layer NL1 and the first p-type layer PL1 into the first active layer EL1. The exciton formed by recoupling or recombining electrons and holes can emit light as the exciton disappears in the first active layer EL1. For example, the first active layer EL1 emits light corresponding to an energy difference between a lowest unoccupied molecular orbital (LUMO) and a highest occupied molecular orbital (HOMO) of the first active layer EL1.

Referring to FIG. 1A, the second emission unit EU2 is disposed on the first emission unit EU1. The second emission unit EU2 includes a p-type electrode PE, a second p-type layer PL2, a second active layer EL2, and a second n-type layer NL2.

Referring to FIG. 1A, the p-type electrode PE of the second emission unit EU2 can be the same component as the p-type electrode PE of the first emission unit EU1. For example, the first emission unit EU1 and the second emission unit EU2 can share the p-type electrode PE. The p-type electrode PE can inject the holes into the second active layer EL2 through the second p-type layer PL2.

The second p-type layer PL2 is disposed on the p-type electrode PE. The second p-type layer PL2 is disposed in a partial area of the p-type electrode PE on the p-type electrode PE. For example, as illustrated in FIG. 1A, the second p-type layer PL2 has a smaller area than the p-type electrode PE and can be disposed on a top surface of the p-type electrode PE.

The second p-type layer PL2 is a layer for injecting holes into the second active layer EL2. For example, the second p-type layer PL2 can be formed by doping a p-type impurity, such as magnesium (Mg), zinc (Zn), and beryllium (Be) on a gallium nitride (GaN) semiconductor layer formed by growing a gallium nitride (GaN) layer, but is not limited thereto.

The second active layer EL2 is disposed on the second p-type layer PL2. The second active layer EL2 is a layer in which electrons and holes are coupled or combined to emit light. For example, the second active layer EL2 can have a multi-quantum well structure in which a plurality of barrier layers and well layers are alternately disposed, the well layer is configured by an indium gallium nitride (InGaN) layer and the barrier layer is configured by gallium nitride (GaN), but is not limited thereto.

The second n-type layer NL2 is disposed on the second active layer EL2. The second n-type layer NL2 is a layer for supplying electrons to the second active layer EL2. For example, the second n-type layer NL2 is formed by doping an n-type impurity, such as silicon Si, on a gallium nitride (GaN) semiconductor layer formed by growing a gallium nitride (GaN) layer, but is not limited thereto.

The second emission unit EU2 can emit light as exciton disappears in the second active layer EL2. For example, when a voltage is applied to each of the second n-type layer NL2 and the p-type electrode PE of the second emission unit EU2, electrons and holes are injected from the second n-type layer NL2 and the second p-type layer PL2 into the second active layer EL2, respectively. The exciton formed by recoupling or recombining electrons and holes can emit light as the exciton disappears in the second active layer EL2. For example, the second active layer EL2 emits light corresponding to an energy difference between a lowest unoccupied molecular orbital (LUMO) and a highest occupied molecular orbital (HOMO) of the second active layer EL2.

As mentioned above, the second emission unit EU2 is disposed on a partial area of the first emission unit EU1. For example, referring to FIG. 1A, any of the areas of the first n-type electrode NE1, the first n-type layer NL1, the first active layer EL1, the first p-type layer PL1, and the p-type electrode PE can be larger than any of the areas of the second p-type layer PL2, the second active layer EL2, and the second n-type layer NL2. Therefore, the second p-type layer PL2, the second active layer EL2, and the second n-type layer NL2 are disposed on a partial area (smaller area) of the top surface of the p-type electrode PE, so that the second p-type layer PL2, the second active layer EL2, and the second n-type layer NL2 may not be disposed in another partial area or remaining area of the top surface of the p-type electrode PE.

The passivation layer PAS is disposed so as to enclose the first n-type layer NL1, the first active layer EL1, the first p-type layer PL1, the p-type electrode PE, the second p-type layer PL2, the second active layer EL2, and the second n-type layer NL2. Further, the passivation layer opens or exposes a part of the p-type electrode PE and a part of the second n-type layer NL2. For example, the passivation layer PAS is disposed so as to enclose a side surface of the first n-type layer NL1, a side surface of the first active layer EL1, a side surface of the first p-type layer PL1, and a side surface and a part of a top surface the p-type electrode PE. Further, the passivation layer PAS encloses a side surface of the second p-type layer PL2, a side surface of the second active layer EL2, and a side surface and a part of a top surface of the second n-type layer NL2.

Therefore, as illustrated in FIG. 1B depicting a top plan view of the light emitting device of FIG. 1A as an example, a part of the p-type electrode PE and a part of the second n-type layer NL2 can be exposed through the passivation layer PAS on the top surface of the light emitting device LED. For instance, a portion of the top surface of the p-type electrode PE and a portion of the top surface of the second n-type layer NL2 can be exposed by and surrounded by the passivation layer PAS. As an example, the size and/or shape of the exposed portion of the top surface of the p-type electrode PE can be the same as or similar to the size and/or shape of the exposed portion of the top surface of the second n-type layer NL2. However, other sizes and shapes are possible.

The passivation layer PAS is disposed so as to enclose the light emitting device LED to protect various components of the light emitting device LED from moisture and oxygen permeating from the outside. The passivation layer PAS can be configured by an insulating material and for example, configured by an inorganic layer formed of silicon nitride (SiNx), silicon oxide (SiOx), and silicon oxynitride (SiON), but is not limited thereto.

The light emitting device LED according to one embodiment of the present disclosure can be a light emitting device with a structure in which the two emission units EU1 and EU2 are laminated. The structure is formed by bonding the first emission unit EU1 and the second emission unit EU2 formed on respective individual wafers so as to face each other with one p-type electrode PE therebetween. For example, the first n-type layer NL1, the first active layer EL1, and the first p-type layer PL1 are formed on a first wafer, and the second n-type layer NL2, the second active layer EL2, and the second p-type layer PL2 are formed on a second wafer. Thereafter, the first n-type layer NL1, the first active layer EL1, and the first p-type layer PL1 and the second n-type layer NL2, the second active layer EL2, and the second p-type layer PL2 are bonded to each other with the p-type electrode PE therebetween. By using this process, the light emitting device LED can be formed and an example of such light emitting device LED is shown in FIG. 1A.

The first emission unit EU1 and the second emission unit EU2 can be configured to emit light with the same color. For example, the first active layer EL1 of the first emission unit EU1 and the second active layer EL2 of the second emission unit EU2 can be formed of a material which emits light with the same color. For example, the first emission unit EU1 and the second emission unit EU2 can emit red, green, blue, or white light, but are not limited thereto.

The first emission unit EU1 and the second emission unit EU2 can emit light with the same color, but a central wavelength of light emitted by the first emission unit EU1 and a central wavelength of light emitted by the second emission unit EU2 can be different. The first emission unit EU1 and the second emission unit EU2 can be formed on different wafers from each other. Therefore, a dominant wavelength λd of light emitted by the first active layer EL1 of the first emission unit EU1 and a dominant wavelength λd of light emitted by the second active layer EL2 of the second emission unit EU2 may not be completely the same, but can be different from each other.

Referring to FIG. 1A, the first emission unit EU1 and the second emission unit EU2 of the light emitting device LED according to the embodiment of the present disclosure share the same p-type electrode PE, and include the first n-type electrode NE1 and the second n-type layer NL2, respectively. Accordingly, the first emission unit EU1 and the second emission unit EU2 are configured to emit light, respectively.

Specifically, the first emission unit EU1 includes the first n-type electrode NE1, the first n-type layer NL1 disposed on the first n-type electrode NE1, the first active layer EL1 disposed on the first n-type layer NL1, the first p-type layer PL1 disposed on the first active layer EL1, and the p-type electrode PE disposed on the first p-type layer PL1. The second emission unit EU2 includes the p-type electrode PE, the second p-type layer PL2 disposed on a partial area of the p-type electrode PE, the second active layer EL2 disposed on the second p-type layer PL2, and the second n-type layer NL2 disposed on the second active layer EL2. For example, the first emission unit EU1 and the second emission unit EU2 include the first n-type electrode NE1 and the second n-type layer NL2, respectively, and are disposed to share the p-type electrode PE. Further, the second p-type layer PL2 of the second emission unit EU2 is disposed on a partial area of the p-type electrode PE to expose the remaining area of the p-type electrode PE.

Accordingly, the p-type electrode PE is disposed between the first p-type layer PL1 of the first emission unit EU1 and the second p-type layer PL2 of the second emission unit EU2, and at the same time, a partial area of the p-type electrode PE is exposed. As such, the p-type electrode PE can be configured to be applied with a voltage from the outside (e.g., external to the LED or a device having the LED) through the exposed partial area of the p-type electrode PE. Thus, in the light emitting device LED according to the embodiment of the present disclosure, the first emission unit EU1 and the second emission unit EU2 can be configured to share the same p-type electrode PE and emit light, simultaneously.

In the meantime, the light emitting device LED according to the embodiment of the present disclosure is configured to laminate the second emission unit EU2 which can emit the same color light as the first emission unit EU1, onto the first emission unit EU1. The first emission unit EU1 and the second emission unit EU2 can be configured to emit light, respectively and/or simultaneously. Therefore, the light emitting device LED can be configured as a redundancy integrated light emitting device LED in which a main emission unit and a redundancy emission unit are integrated.

Specifically, the light emitting device LED according to the embodiment of the present disclosure can have a structure in which the first emission unit EU1 and the second emission unit EU2 which emit light, respectively, are laminated to each other. At this time, the second emission unit EU2 is disposed as an emission unit which emits the same color light as the first emission unit EU1, so that the first emission unit EU1 and the second emission unit EU2 can selectively serve as a main emission unit and a redundancy emission unit for the main emission unit.

For example, when the first emission unit EU1 is a main emission unit and the second emission unit EU2 is a redundancy emission unit, a voltage can be applied only to the p-type electrode PE and the first n-type electrode NE1 to allow only the first emission unit EU1 to emit light. In addition or in the alternative, a voltage can be applied to the p-type electrode PE, the first n-type electrode NE1, and the second n-type layer NL2 to allow both the first emission unit EU1 and the second emission unit EU2 to emit light.

In another example, if the first emission unit EU1 being the main emission unit has a difficulty to normally emit light, a voltage can be applied to the second n-type layer NL2 and the p-type electrode PE to allow only the second emission unit EU2 to emit light, whereby the second emission unit EU2 can function as a secondary/auxiliary emission unit or a redundancy emission unit. Therefore, the light emitting device LED according to the embodiment of the present disclosure can be configured as a redundancy integrated light emitting device LED in which a main emission unit and a redundancy emission unit are integrated and can be selectively used. Accordingly, when the light emitting device LED according to the embodiment of the present disclosure is used, two emission units are implemented and effectively integrated into one light emitting device LED so that an area occupied by the main emission unit and the redundancy emission unit can be reduced and minimized.

Furthermore, when the light emitting device LED according to the embodiment of the present disclosure is used, a usage yield of the light emitting device LED can be improved. Hereinafter, an effect of improving the usage yield will be described in more detail with reference to FIGS. 2A to 2C.

Figure 2A:
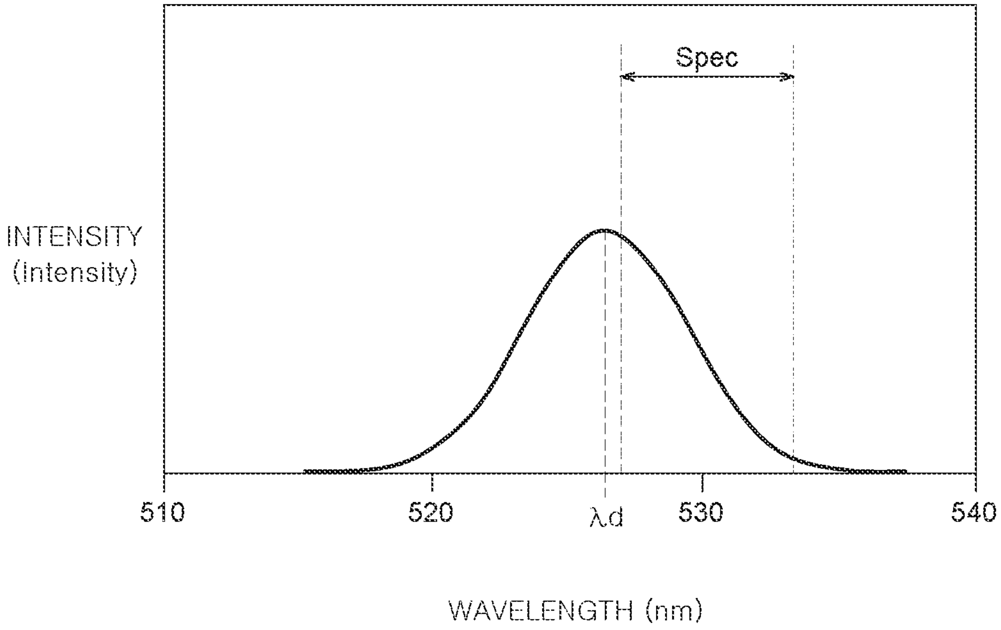
FIG. 2A is a graph measuring a dominant wavelength of a light emitting device according to a first comparative example.
Figure 2B:
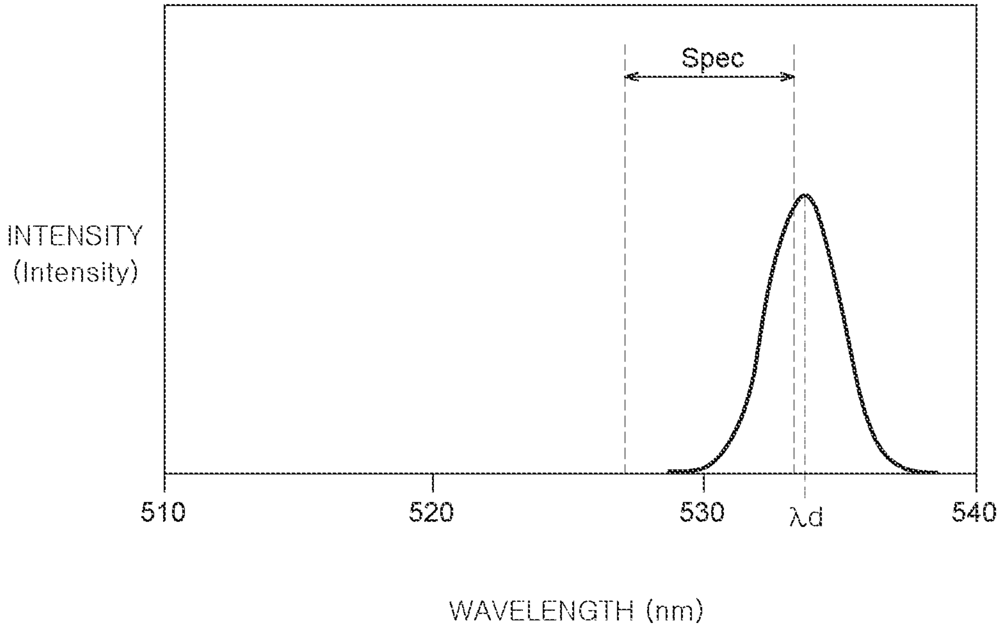
FIG. 2B is a graph measuring a dominant wavelength of a light emitting device according to a second comparative example.
Figure 2C:
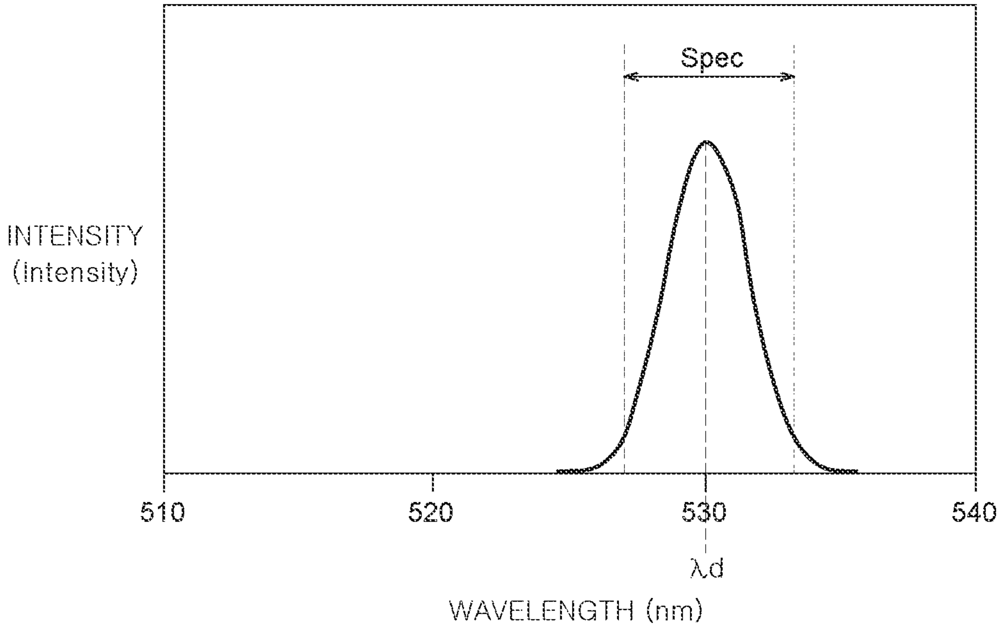
FIG. 2C is a graph measuring a dominant wavelength of a light emitting device according to an embodiment of the present disclosure.

FIG. 2A is a graph measuring a dominant wavelength of a light emitting device according to a first comparative example. FIG. 2B is a graph measuring a dominant wavelength of a light emitting device according to a second comparative example. FIG. 2C is a graph measuring a dominant wavelength of a light emitting device according to an embodiment of the present disclosure. These graphs show measurements taken to compare the light emitting device of the present disclosure to other light emitting devices of the related art.

Particularly, the light emitting device according to the first comparative example of FIG. 2A is one emission unit which is grown on one wafer, and the graph of FIG. 2A is a graph illustrating an intensity of light emitted from the light emitting device according to the first comparative example according to the wavelength. The light emitting device according to the second comparative example of FIG. 2B is another emission unit formed by being grown on a wafer which is different from the first comparative example, and has an area smaller than the light emitting device of the first comparative example. The graph of FIG. 2B is a graph illustrating an intensity of light emitted from the light emitting device of the second comparative example according to the wavelength.

In contrast, the light emitting device of FIG. 2C is a light emitting device LED described with reference to FIGS. 1A and 1B, and the graph of FIG. 2C is a graph illustrating an intensity of light emitted from the light emitting device LED according to the embodiment of the present disclosure according to the wavelength. At this time, as an example only, it can be assumed that the first emission unit EU1 of the light emitting device LED according to the embodiment of the present disclosure can be the light emitting device according to the first comparative example, and the second emission unit EU2 can be the light emitting device according to the second comparative example. For example, it is assumed that the light emitting device LED according to the embodiment of the present disclosure is formed by bonding the light emitting device according to the first comparative example and the light emitting device according to the second comparative example.

At this time, all the light emitting devices according to the first comparative example, the second comparative example, and the embodiment of the present disclosure emit green light.

In FIGS. 2A to 2C, the dominant wavelength λd is a mean value of wavelengths of light emitted from about 400 light emitting devices formed on a same wafer. On the graph of FIGS. 2A to 2C, the X-axis represents a wavelength (nm) of light emitted from each light emitting device, and the Y-axis represents an intensity (intensity) of such light according to the wavelength. Each mean wavelength value was identified from the graphs of FIGS. 2A to 2C. Accordingly, dominant wavelengths λd of light emitted from each of the light emitting devices according to the first comparative example and the second comparative example and the light emitting device according to the embodiment of the present disclosure were measured. In the meantime, an allowable specification range (Spec) of the light emitted from a good quality light emitting device can be considered to be 530 nm±3 nm. For example, when the dominant wavelength λd of the light emitting devices satisfies the range of 530 nm±3 nm, it can mean that such light emitting device has a good quality.

First, referring to FIG. 2A, in the case of the light emitting device of the first comparative example, a dominant wavelength λd was measured to be 526.37 nm and a standard deviation StDEV was measured to be 2.99 nm. That is, the dominant wavelength λd of the light emitting device of the first comparative example did not satisfy 530 nm±3 nm, which is the allowable specification range of the good quality light emitting device. As such, all such light emitting devices according to the first comparative example need to be discarded in principle.

Next, referring to FIG. 2B, in the case of the light emitting device of the second comparative example, a dominant wavelength λd was measured to be 533.6 nm and a standard deviation StDEV was measured to be 1.32 nm. That is, the dominant wavelength λd of the light emitting device of the second comparative example also did not also satisfy 530 nm±3 nm, which is the allowable specification range of the good quality light emitting device. As such, all such light emitting devices according to the second comparative example need to be discarded in principle.

Finally, the light emitting device LED according to the embodiment of the present disclosure, as described above, was formed by bonding the first emission unit EU1 (e.g., which can the light emitting device according to the first comparative example) and the second emission unit EU2 (e.g., which can be the light emitting device according to the second comparative example).

Referring to FIG. 2C, in the case of the light emitting device LED according to the embodiment of the present disclosure, light emitted from the first emission unit EU1 and the second emission unit EU2 was mixed so that the dominant wavelength λd was measured to be 529.99 nm and the standard deviation StDEV was measured to be 1.48 nm. That is, the dominant wavelength λd of the light emitting device LED according to the embodiment of the present disclosure satisfies well the allowable specification range of the good quality light emitting device, which is 530 nm±3 nm. As such, all such light emitting devices can be considered good quality light emitting devices and can be used without being discarded.

Accordingly, the light emitting device LED according to the embodiment of the present disclosure is configured to have a structure in which the first emission unit EU1 and the second emission unit EU2 formed on respective individual wafers are laminated to each other to improve the yield of the light emitting device LED.

Specifically, the light emitting device LED according to the embodiment of the present disclosure is configured by laminating two emission units, which do not satisfy the allowable specification range of the good light emitting device, so as to mix the wavelengths of light emitted therefrom, respectively. Therefore, as illustrated in FIG. 2C, the light emitting device LED according to the embodiment of the present disclosure can be configured to satisfy fully the allowable specification range of the good quality light emitting device by mixing the wavelengths of the first emission unit EU1 and the second emission unit EU2. Accordingly, the light emitting device LED according to the embodiment of the present disclosure can be formed using an emission unit which needs to be discarded, so that the yield of the light emitting device LED can be improved and the manufacturing cost of the light emitting device LED can be reduced.

Hereinafter, a display apparatus 100 according to an embodiment of the present disclosure to which the above-described light emitting device LED (e.g., the LED of FIGS. 1A and 1B) according to the embodiment of the present disclosure is applied will be described with reference to FIG. 3.

Figure 3:
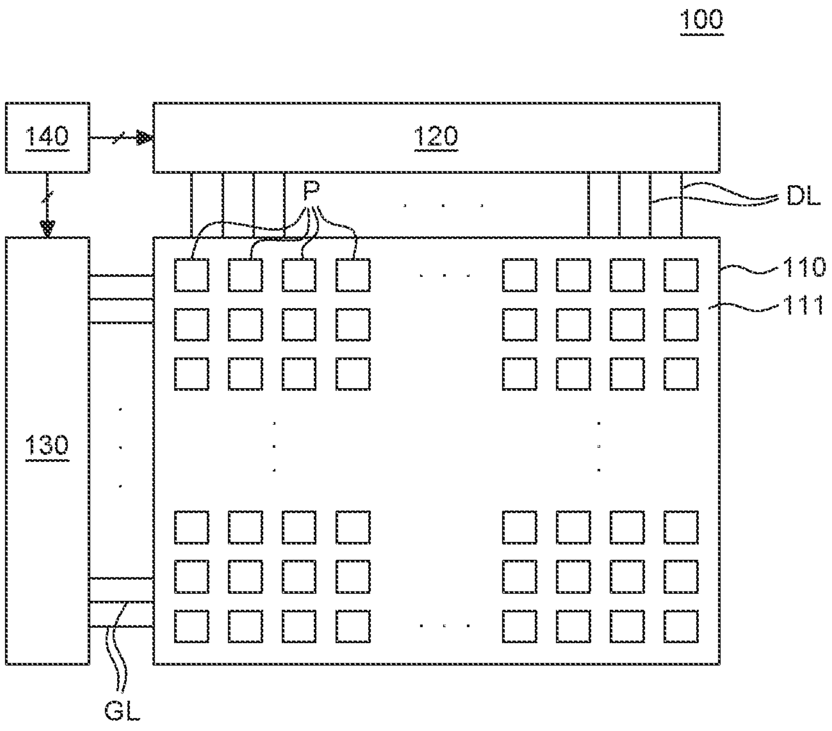
FIG. 3 is a schematic view of a display apparatus according to an embodiment of the present disclosure.

FIG. 3 is a schematic view of the display apparatus 100 according to an embodiment of the present disclosure. In FIG. 3, for the convenience of description, among various components of the display apparatus 100, a display panel 110, a data driver 120, a gate driver 130, a timing controller 140, a plurality of pixels P, a plurality of data lines DL, and a plurality of gate lines GL are illustrated.

Referring to FIG. 3, the display apparatus 100 according to the embodiment of the present disclosure includes the display panel 110, the data driver 120, the gate driver 130, and the timing controller 140.

The display panel 110 is a panel for displaying images. The display panel 110 can include various circuits, wiring lines, and light emitting devices LED disposed on the substrate 111. On the substrate 111 of the display panel 110, the plurality of data lines DL and the plurality of gate lines GL intersecting each other are disposed, where a plurality of pixels P connected to the plurality of data lines DL and the plurality of gate lines GL can be defined. The display panel 110 can include an active area defined by the plurality of pixels P and a non-active area in which various signal lines or pads are formed. One or more non-active areas can be adjacent to one or more active areas. The display panel 110 can be implemented as a display panel 110 used in various light emitting display apparatuses such as a liquid crystal display apparatus, an organic light emitting display apparatus, a light emitting display apparatus using an LED, or an electrophoretic display apparatus. Hereinafter, it is described that the display panel 110 is a panel used in the light emitting display apparatus including the LED, but is not limited thereto.

The timing controller 140 receives timing signals such as a vertical synchronization signal, a horizontal synchronization signal, a data enable signal, or a dot clock by using a receiving circuit such as an LVDS (low voltage differential signaling) or TMDS (transition-minimized differential signaling) interface connected to a host system. The timing controller 140 generates timing control signals based on the input timing signal to control the data driver 120 and the gate driver 130.

The data driver 120 is connected to the plurality of data lines DL of the display panel 110, and supplies a data voltage to the plurality of unit pixels P. The data driver 120 can include a plurality of source drive integrated circuits (ICs). The plurality of source drive ICs can be supplied with digital video data and a source timing control signal from the timing controller 140. The plurality of source drive ICs converts digital video data into a gamma voltage in response to the source timing control signal to generate a data voltage and supply the data voltage through the plurality of data lines DL of the display panel 110. The plurality of source drive ICs can be connected to the plurality of data lines DL of the display panel 110 by a chip on glass (COG) process, a chip on film (COF) process, or a tape automated bonding (TAB) process. Further, the plurality of source drive ICs can be formed on the display panel 110, or can be formed on a separate printed circuit board (PCB) substrate to be connected to the display panel 110. The embodiments of the present disclosure are not limited thereto.

The gate driver 130 is connected to the plurality of gate lines GL of the display panel 110 and supplies a gate signal to the plurality of pixels P. The gate driver 130 can include a level shifter and a shift register. The level shifter shifts a level of a clock signal input at a transistor-transistor-logic (TTL) level from the timing controller 140 and then can supply the shifted clock signal to the shift register. The shift register can be formed in the non-active area of the display panel 110, by a GIP (gate in panel) manner, but is not limited thereto. The shift register can be configured by a plurality of stages which shift the gate signal to output, in response to the clock signal and the driving signal. The plurality of stages included in the shift register can sequentially output the gate signal through a plurality of output terminals.

Hereinafter, a plurality of sub pixels SP disposed in one pixel P of the display apparatus 100 according to an embodiment of the present disclosure will be described in more detail with reference to FIGS. 4A to 5B. For instance, each pixel P of the display apparatus 100 or any other display apparatus of the present disclosure can be composed of a plurality of sub pixels SP shown in FIGS. 4A to 5B.

Figure 4A:
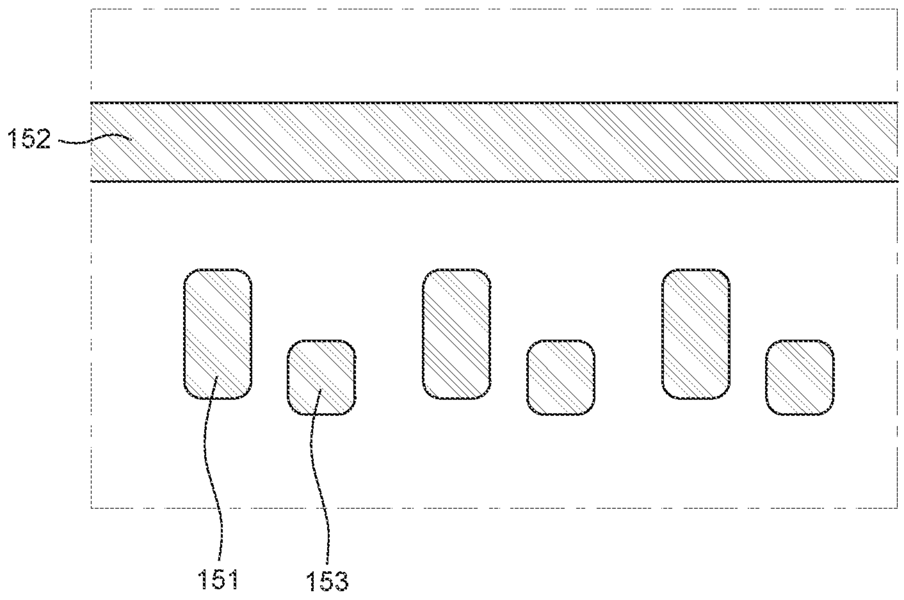
FIGS. 4A and 4B are schematic plan views of one pixel of a display apparatus according to an embodiment of the present disclosure.
Figure 4B:
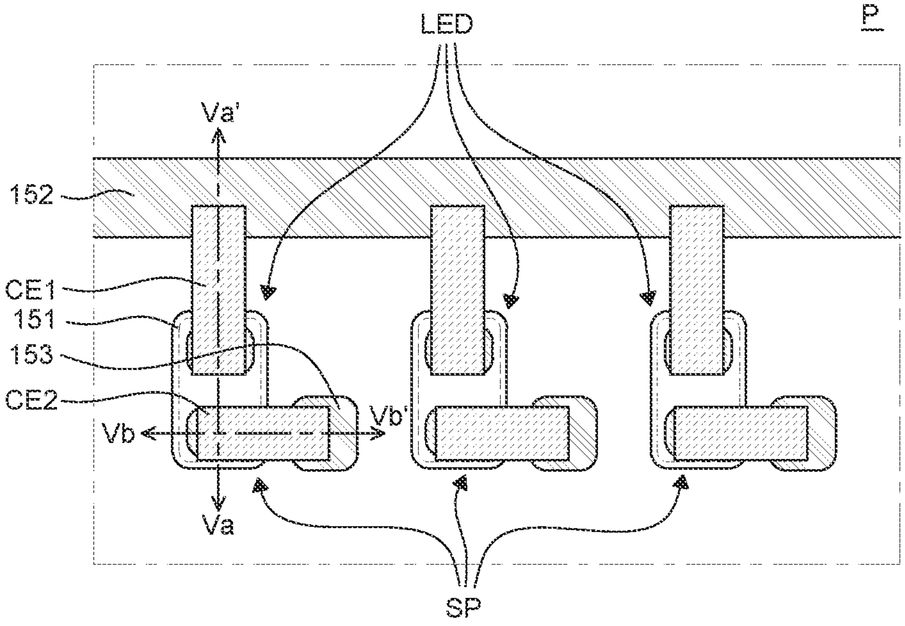
Figure 5A:
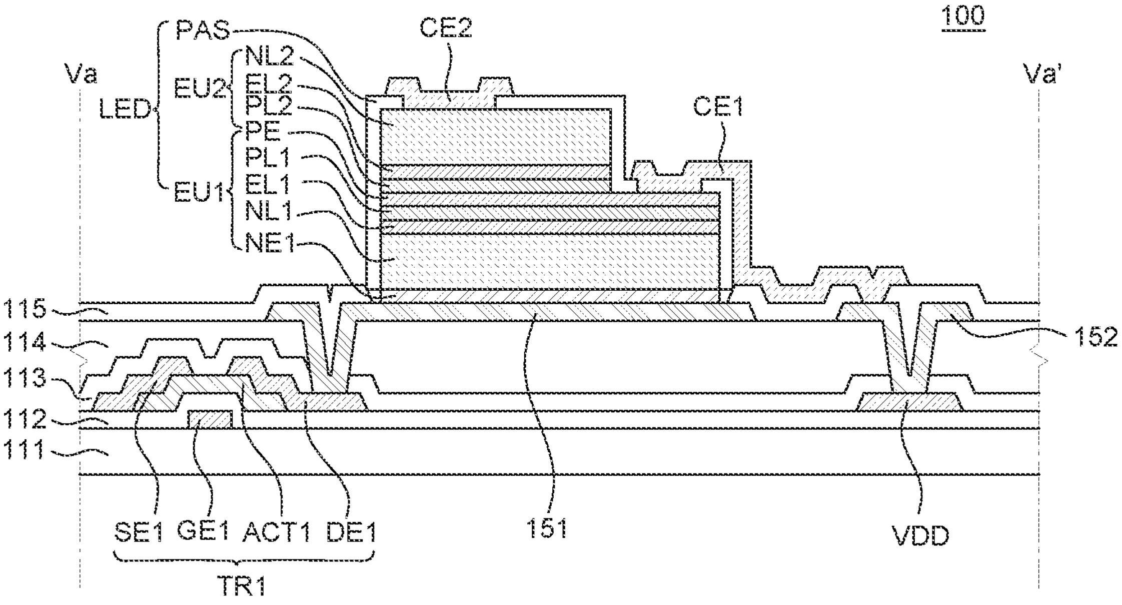
FIG. 5A is a cross-sectional view taken along a line Va-Va' of FIG. 4B.
Figure 5B:
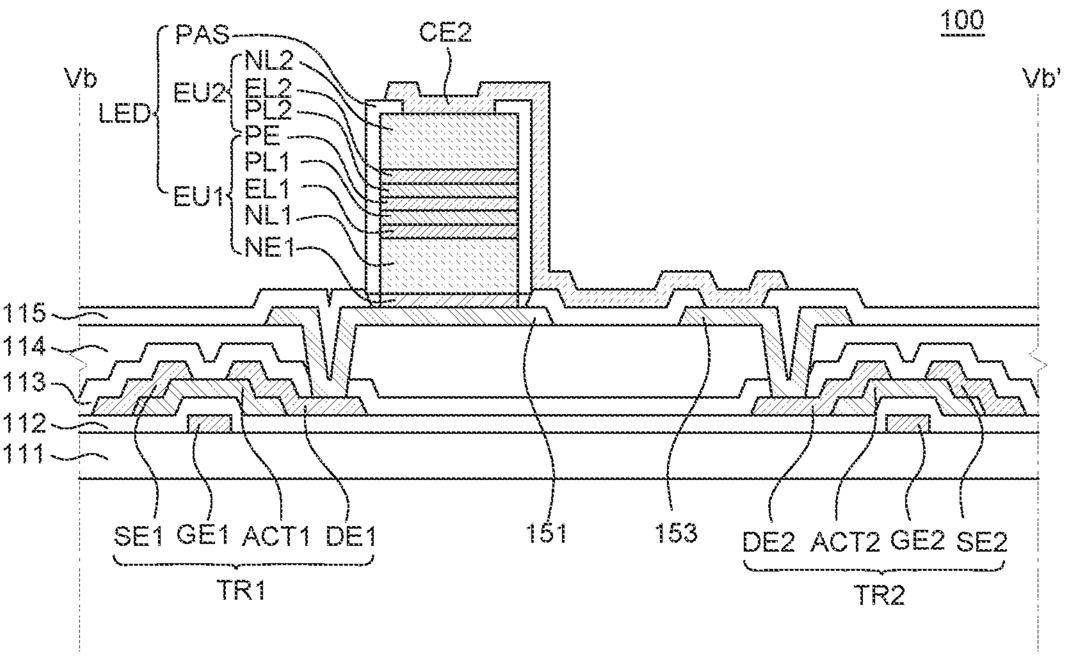
FIG. 5B is a cross-sectional view taken along a line Vb-Vb' of FIG. 4B.

FIGS. 4A and 4B are schematic plan views of one pixel P of a display apparatus according to an embodiment of the present disclosure. FIG. 5A is a cross-sectional view taken along the line Va-Va' of FIG. 4B. FIG. 5B is a cross-sectional view taken along the line Vb-Vb' of FIG. 4B. For the convenience of description, in FIG. 4A, a first individual electrode 151, a common electrode 152, and a second individual electrode 153 are illustrated, among various components of the one pixel P.

Referring to FIGS. 4A and 4B, one pixel P of the display apparatus 100 according to the embodiment of the present disclosure includes a plurality of sub pixels SP and in the plurality of sub pixels SP, a plurality of light emitting devices LED are disposed, respectively. For instance, each pixel P includes a plurality of subpixels SP, and each of such subpixels SP can include a light emitting device LED of the present disclosure.

Referring to FIG. 4B, one pixel P can include a plurality of sub pixels SP, for example, a red sub pixel which emits red light, a green sub pixel which emits green light, and a blue sub pixel which emits blue light, and can further include a white sub pixel which emits white light, but is not limited thereto.

Referring to FIG. 4B, as described above, in the display apparatus 100 according to the embodiment of the present disclosure, the light emitting devices LED disposed in each of the plurality of sub pixels SP of one pixel P are connected to the same common electrode 152. Further, the light emitting devices LED are also connected to different first individual electrodes 151 and different second individual electrodes 153 from each other. For example, in one pixel P, a common electrode 152 which is connected to all the light emitting devices LED that are disposed in the plurality of sub pixels SP, and first individual electrodes 151 and second individual electrodes 153 to which the light emitting devices LED disposed in the plurality of sub pixels SP are connected, are disposed. Therefore, a connecting method of one light emitting device LED and the first individual electrodes 151, the common electrode 152, and the second individual electrodes 153 can be formed by bonding the first n-type electrode NE1 of the light emitting device LED onto the first individual electrode 151, connecting the p-type electrode PE of the light emitting device LED to the common electrode 152 through the first connection electrode CE1, and connecting the second n-type layer NL2 to the second individual electrode 153 through the second connection electrode CE2. Detailed description thereof will be made below with reference to FIGS. 5A and 5B.

FIG. 5A is a cross-sectional view taken along the line Va-Va' of FIG. 4B.

FIG. 5B is a cross-sectional view taken along the line Vb-Vb' of FIG. 4B.

Referring to FIGS. 5A and 5B together, the display apparatus 100 according to the embodiment of the present disclosure includes a substrate 111, a first transistor TR1, a second transistor TR2, a high potential power line VDD, a first individual electrode 151, a common electrode 152, a second individual electrode 153, a light emitting device LED, a first connection electrode CE1, and a second connection electrode CE2.

Referring to FIGS. 5A and 5B, the substrate 111 is disposed in a lower portion of the display apparatus 100. The substrate 111 can support and protect various components of the display apparatus 100. The substrate 111 can be formed of a transparent material, such as glass, but is not limited thereto.

The first transistor TR1 and the second transistor TR2 can be disposed in each of the plurality of sub pixels, on the substrate 111.

The first transistor TR1, the second transistor TR2, and the high potential power line VDD are disposed on the substrate 111.

Referring to FIGS. 5A and 5B, the first transistor TR1 is connected to the first individual electrode 151, and the second transistor TR2 is connected to the second individual electrode 153. For example, both the first transistor TR1 and the second transistor TR2 are connected to one same light emitting device LED. Specifically, the first transistor TR1 is connected to a first emission unit EU1 of the light emitting device LED, and the second transistor TR2 is connected to a second emission unit EU2 of the same light emitting device LED. Therefore, the first transistor TR1 can control the driving of the first emission unit EU1, and the second transistor TR2 can control the driving of the second emission unit EU2. The first transistor TR1 and the second transistor TR2 are individually controlled so that the first emission unit EU1 and the second emission unit EU2 of the light emitting device LED can be configured to emit light, individually (e.g., separately or selectively).

In the meantime, as the first emission unit EU1 and the second emission unit EU2 of the light emitting device LED are configured to emit light, individually, one emission unit among the first emission unit EU1 and the second emission unit EU2 can be selected as a redundancy emission unit and can be used, if the other emission unit among the first and second emission units EU1 and EU2 becomes defective or is not operating properly. In another example, the first and second emission units EU1 and EU2 can operate as the main and auxiliary (additional) emission units to emit light simultaneously.

The first transistor TR1 and the second transistor TR2 can be used as driving elements of the display apparatus 100. The first transistor TR1 includes a first gate electrode GE1, a first active layer ACT1, a first source electrode SE1, and a first drain electrode DE1, whereas the second transistor TR2 includes a second gate electrode GE2, a second active layer ACT2, a second source electrode SE2, and a second drain electrode DE2.

In the display apparatus 100 according to the embodiment of the present disclosure, a bottom gate type transistor in which gate electrodes GE1 and GE2 of the first transistor TR1 and the second transistor TR2 are disposed on the bottom, the active layers ACT1 and ACT2 are disposed on the gate electrodes GE1 and GE2, and the source electrodes SE1 and SE2 and the drain electrodes DE1 and DE2 are disposed on the active layers ACT1 and ACT2 is illustrated. However, the present disclosure is not limited thereto, and other types are possible.

The first gate electrode GE1 of the first transistor TR1 and the second gate electrode GE2 of the second transistor TR2 are disposed on the substrate 111. The first gate electrode GE1 and the second gate electrode GE2 can be any one of various metal materials, for example, any one of tantalum (Ta), molybdenum (Mo), aluminum (Al), chrome (Cr), gold (Au), titanium (Ti), nickel (Ni), neodymium (Nd), and copper (Cu), an alloy of two or more thereof, or a multiple layer thereof, but it is not limited thereto.

The gate insulating layer 112 is disposed on the first gate electrode GE1 of the first transistor TR1 and the second gate electrode GE2 of the second transistor TR2. The gate insulating layer 112 is a layer for electrically insulating the first gate electrode GE1 and the second gate electrode GE2 from the first active layer ACT1 and the second active layer ACT2, respectively, and can be formed of an insulating material. For example, the gate insulating layer 112 can be formed as a single layer of silicon nitride (SiNx) or silicon oxide (SiOx) which is an inorganic material or a multiple layer of silicon nitride (SiNx) or silicon oxide (SiOx), but it is not limited thereto.

The first active layer ACT1 and the second active layer ACT2 are disposed on the gate insulating layer 112. The first active layer ACT1 and the second active layer ACT2 are disposed so as to overlap the first gate electrode GE1 and the second gate electrode GE2, respectively. For example, the first active layer ACT1 and the second active layer ACT2 can be also formed of an oxide semiconductor, amorphous semiconductor such as amorphous silicon (a-Si), polycrystalline silicon (poly-Si), or an organic semiconductor, but are not limited thereto.

The first source electrode SE1 and the second source electrode SE2 and the first drain electrode DE1 and the second drain electrode DE2 are disposed on the first active layer ACT1 and the second active layer ACT2, respectively. The first source electrode SE1 and the second source electrode SE2 and the first drain electrode DE1 and the second drain electrode DE2 are disposed on the same layer to be spaced apart from each other. The first source electrode SE1 and the second source electrode SE2 and the first drain electrode DE1 and the second drain electrode DE2 can be electrically connected to the first active layer ACT1 and the second active layer ACT2, respectively, in a way to contact with the first active layer ACT1 and the second active layer ACT2, respectively. At this time, the first drain electrode DE1 and the second drain electrode DE2 can be utilized as first electrodes which apply a signal to the same light emitting device LED. The first source electrode SE1 and the second source electrode SE2 and the first drain electrode DE1 and the second drain electrode DE2 can be any one of various metal materials, for example, any one of tantalum (Ta), molybdenum (Mo), aluminum (Al), chrome (Cr), gold (Au), titanium (Ti), nickel (Ni), neodymium (Nd), and copper (Cu), or an alloy of two or more thereof, or a multiple layer thereof, but are not limited thereto.

The high potential power line VDD is disposed to be adjacent to the first transistor TR1 and the second transistor TR2. Specifically, the high potential power line VDD is disposed on the gate insulating layer 112 to be spaced apart from the source electrode and the drain electrode on the same layer, and can be formed of the same material as a source electrode material and a drain electrode material, or can be also formed of the same material as the gate electrode material. However, it is not limited thereto.

A high potential voltage is supplied to the high potential power line VDD. The high potential power line VDD is connected to the common electrode (e.g., 152). The high potential power line VDD can be connected to the p-type electrode PE of the light emitting device LED through the common electrode 152 and the first connection electrode CE1. Accordingly, the high potential power line VDD can transmit a high potential voltage to the common electrode 152 and the p-type electrode PE of the light emitting device LED.

The first insulating layer 113 is disposed on the first transistor TR1, the second transistor TR2, and the high potential power line VDD. The first insulating layer 113 is disposed above the first transistor TR1, the second transistor TR2, and the high potential power line VDD to protect the first transistor TR1, the second transistor TR2, and the high potential power line VDD. The first insulating layer 113 can be an inorganic insulating layer. For example, the first insulating layer 113 can be configured by a single layer of silicon nitride (SiNx) or silicon oxide (SiOx) which is an inorganic material or a multiple layer of silicon nitride (SiNx) or silicon oxide (SiOx), but it is not limited thereto.

The second insulating layer 114 is disposed on the first insulating layer 113. A top surface of the second insulating layer 114 has a surface parallel to the substrate 111. Therefore, the second insulating layer 114 can planarize a step difference caused by the components, such as a transistor and wiring lines disposed therebelow. Therefore, the second insulating layer 114 can also be referred to as a planarization layer. The second insulating layer 114 can be an organic insulating layer. For example, the second insulating layer 114 can be formed of one of photo acryl, acrylic resin, epoxy resin, phenol resin, polyamide resin, polyimide resin, unsaturated polyester resin, polyphenylene resin, polyphenylene sulfide resin, benzocyclobutene, and photoresist, but is not limited thereto. Therefore, the second insulating layer can be also configured with multiple layered structure such as an inorganic layer/organic layer or an inorganic layer/organic layer/inorganic layer.

The first individual electrode 151, the common electrode 152, and the second individual electrode 153 are disposed on the second insulating layer 114. As described above, the light emitting devices LED which are disposed in the plurality of sub pixels SP of one pixel P are connected to the same common electrode 152, and are connected to different first individual electrodes 151 from each other and different second individual electrodes 153 from each other. For example, one light emitting device LED is connected to the first individual electrode 151, the common electrode 152, and the second individual electrode 153. Further, as illustrated in FIGS. 4A and 4B, all the light emitting devices LED disposed in the plurality of sub pixels SP of one pixel P are connected to the same common electrode 152.

For example, the first individual electrode 151, the common electrode 152, and the second individual electrode 153 can be formed of the same material on the same layer. Therefore, the first individual electrode 151, the common electrode 152, and the second individual electrode 153 can be formed by the same process, but are not limited thereto.

The first individual electrode 151 is connected to the first drain electrode DE1 of the first transistor TR1. Specifically, the first individual electrode 151 can be connected to the first drain electrode DE1 of the first transistor TR1 through a contact hole formed in the first insulating layer 113 and the second insulating layer 114.

The common electrode 152 is connected to the high potential power line VDD. Specifically, the common electrode 152 can be connected to the high potential power line VDD through the contact hole formed in the first insulating layer 113 and the second insulating layer 114. As illustrated in FIGS. 4A and 4B, the common electrode 152 can be disposed in the form of a wiring line so as to be connected to the plurality of light emitting devices LED, but is not limited thereto.

The second individual electrode 153 is connected to the second drain electrode DE2 of the second transistor TR2. Specifically, the second individual electrode 153 can be connected to the second drain electrode DE2 of the second transistor TR2 through a contact hole formed in the first insulating layer 113 and the second insulating layer 114.

The common electrode 152, the first individual electrode 151, and the second individual electrode 153 can be any one of various metal materials having conductivity, for example, any one of tantalum (Ta), molybdenum (Mo), aluminum (Al), chrome (Cr), gold (Au), titanium (Ti), nickel (Ni), neodymium (Nd), and copper (Cu) or an alloy of two or more thereof, or a multiple layer thereof, but it is not limited thereto. Further, the common electrode 152, the first individual electrode 151, and the second individual electrode 153 can be simultaneously formed with the same material.

In the meantime, the display apparatus 100 according to the embodiment of the present disclosure can be formed with a common anode structure in which both the first individual electrode 151 and the second individual electrode 153 are cathodes and the common electrode 152 is an anode. Specifically, in the display apparatus 100 according to the embodiment of the present disclosure, a high potential voltage can be transmitted to the common electrode 152. A constant high potential power signal from the high potential power line VDD is supplied to the common electrode 152 which is an anode, and different signals can be supplied to the first individual electrode 151 and the second individual electrode 153 which are cathodes, at every frame, in response to a data signal. Therefore, a driving circuit of each sub pixel SP of the display apparatus 100 can be formed with a common anode structure.

The third insulating layer 115 is disposed on the first individual electrode 151, the common electrode 152, and the second individual electrode 153. The third insulating layer 115 is disposed above the first individual electrode 151, the common electrode 152, and the second individual electrode 153 to protect the first individual electrode 151, the common electrode 152, and the second individual electrode 153. The third insulating layer 115 can be an inorganic insulating layer. For example, the third insulating layer 115 can be configured by a single layer of silicon nitride (SiNx) or silicon oxide (SiOx) which is an inorganic material or a multiple layer of silicon nitride (SiNx) or silicon oxide (SiOx), but it is not limited thereto.

The light emitting device LED is disposed on the third insulating layer 115. Specifically, the light emitting device LED is disposed on the first individual electrode 151 exposed from the third insulating layer 115, as illustrated in FIGS. 5A and 5B. Therefore, the light emitting device LED can be electrically connected to (e.g., in direct contact with) the first individual electrode 151.

The light emitting device LED includes the first emission unit EU1, the second emission unit EU2, and the passivation layer PAS, and is in this example the light emitting device LED of FIGS. 1A and 1B. The first emission unit EU1 includes the first n-type electrode NE1, the first n-type layer NL1 disposed on the first n-type electrode NE1, the first active layer EL1 disposed on the first n-type layer NL1, the first p-type layer PL1 disposed on the first active layer EL1, and the p-type electrode PE disposed on the first p-type layer PL1. The second emission unit EU2 includes the p-type electrode PE, the second p-type layer PL2 disposed on the p-type electrode PE, the second active layer EL2 disposed on the second p-type layer PL2, and the second n-type layer NL2 disposed on the second active layer EL2. The passivation layer PAS is disposed so as to enclose a side surface of the first n-type layer NL1, a side surface of the first active layer EL1, a side surface of the first p-type layer PL1, and a side surface and a part of a top surface the p-type electrode PE. Further, the passivation layer encloses a side surface of the second p-type layer PL2, a side surface of the second active layer EL2, and a side surface and a part of a top surface of the second n-type layer NL2. Therefore, as illustrated in FIG. 1B, a part of the p-type electrode PE and a part of the second n-type layer NL2 can be exposed from the passivation layer PAS on the top surface of the light emitting device LED.

The first connection electrode CE1 can be disposed on the p-type electrode PE of the light emitting device LED. The second connection electrode CE2 can be disposed on the second n-type layer NL2. Specifically, the first connection electrode CE1 is disposed on the part of the p-type electrode PE that is exposed from the passivation layer PAS of the light emitting device LED, and the second connection electrode CE2 is disposed on the part of the second n-type layer NL2 that is exposed from the passivation layer PAS of the light emitting device LED.

The first connection electrode CE1 extends on the p-type electrode PE of the light emitting device LED to be disposed on the common electrode 152 exposed from the third insulating layer 115 as shown in FIG. 4B. The first connection electrode CE1 can connect the p-type electrode PE of the light emitting device LED and the common electrode 152. Therefore, the first connection electrode CE1 can electrically connect the p-type electrode PE of the light emitting device LED and the common electrode 152.

For example, the first connection electrode CE1 can be formed of a transparent conductive oxide, such as indium tin oxide (ITO) or indium zinc oxide (IZO), but is not limited thereto.

The second connection electrode CE2 extends on the second n-type layer NL2 of the light emitting device LED to be disposed on the second individual electrode 153 exposed from the third insulating layer 115 as shown in FIG. 4B. The second connection electrode CE2 can connect the second n-type layer NL2 of the light emitting device LED and the second individual electrode 153. Therefore, the second connection electrode CE2 can electrically connect the second n-type layer NL2 of the light emitting device LED and the second individual electrode 153.

For example, the second connection electrode CE2 can be formed of a transparent conductive oxide, such as indium tin oxide (ITO) or indium zinc oxide (IZO), but is not limited thereto.

In the meantime, in the display apparatus 100 according to the embodiment of the present disclosure, during the normal operation of the light emitting device LED, only the second transistor TR2 among the first transistor TR1 and the second transistor TR2 can be driven. For example, when the light emitting device LED normally operates, the second emission unit EU2 can emit light as the main emission unit. However, if the second emission unit EU2 is not properly operating or becomes defective, the first transistor TR1 is driven so that the first emission unit EU1 can emit light as a backup emission unit. For example, the second emission unit EU2 is configured as a main light emitting device, whereas the first emission unit EU1 can be configured as a redundancy light emitting device.

In the display apparatus 100 according to the embodiment of the present disclosure, one light emitting device LED is configured with a structure in which both a main emission unit and a redundancy emission unit are laminated to each other, so as to minimize a space for placing such redundancy light emitting device.

In order to solve or address a limitation when a light emitting device does not emit light or abnormally emits light due to any issue or defect during the manufacturing process of the display apparatus so that an aesthetic sense of the display apparatus may be degraded, an extra redundancy light emitting device can be disposed separately from the light emitting device in the present embodiments. Therefore, when a defective light emitting device is generated, the redundancy light emitting device (instead of the defective light emitting device) emits light, so that the degradation of the aesthetic sense due to any defective light emitting device issue can be effectively addressed.

Further, as the redundancy light emitting device is further disposed, an emission area of the display apparatus can be reduced as much as a space for providing the redundancy light emitting device in plan view. This can cause an additional issue of degrading the resolution of a display apparatus. Accordingly, in the display apparatus 100 according to the embodiment of the present disclosure, one light emitting device LED is configured with a structure in which two emission units EU1 and EU2 are laminated to each other therein. For example, the first emission unit EU1 and the second emission unit EU2 are disposed to overlap each other so that an additional space for disposing another light emitting unit in a plane may not be necessary in the light emitting device LED of the present embodiments.

Moreover, as a space for disposing a redundancy light emitting device is minimized or reduced, more light emitting devices LED can be disposed in the same area so that the display device 100 can be implemented with a higher resolution. Accordingly, in the display apparatus 100 according to the embodiment of the present disclosure, one light emitting device LED is configured with a structure in which both a main emission unit and a redundancy emission unit are laminated therein to minimize a space for placing a redundancy light emitting device. Further, the display apparatus 100 with a high resolution can be implemented.

Specifically, as described above, in the display apparatus 100 according to the embodiment of the present disclosure, one light emitting device LED is configured with a structure in which a main emission unit and a redundancy emission unit are laminated to each other therein to minimize a space for placing a redundancy light emitting device.

Further, in the case of a transparent display apparatus in which a transmissive area and an emission area are disposed in the active area, a space for disposing the transmissive area can be demanded. Therefore, a designated additional space for a redundancy light emitting device is not needed and is omitted, and such space can instead be used as a transparent area so that the transparent area expands and the transmittance of the display apparatus 100 can be improved. For example, when the display apparatus 100 according to the embodiment of the present disclosure is applied to a transparent display apparatus, the display apparatus 100 with a higher transmittance can be implemented. Accordingly, in the display apparatus 100 according to the embodiment of the present disclosure, a space for disposing a redundancy light emitting device is minimized or reduced so that a display apparatus with a high transmittance can be implemented. By doing this, the low power display apparatus 100 can be implemented.

Hereinafter, a display apparatus according to another embodiment of the present disclosure will be described in detail.

In the display apparatus according to another embodiment of the present disclosure, when the light emitting device LED normally operates, only the first transistor TR1, among the first transistor TR1 and the second transistor TR2, is driven and the first emission unit EU1 emits light. Accordingly, an emission area of the display apparatus is increased to reduce a current density of the light emitting device LED.

Specifically, in the display apparatus 100 according to another embodiment of the present disclosure, during the normal operation of the light emitting device LED, only the first transistor TR1 among the first transistor TR1 and the second transistor TR2 can be driven. For example, when the light emitting device LED normally operates, the first emission unit EU1 can emit light. On the other hand, when the first emission unit EU1 becomes defective or is not operating properly, the second transistor TR2 is driven so that the second emission unit EU2 can emit light. For example, the first emission unit EU1 is configured as a main light emitting device LED, and the second emission unit EU2 can be configured as a redundancy light emitting device.

Referring to FIGS. 1A and 5A, areas of the first n-type electrode NE1, the first n-type layer NL1, the first active layer EL1, the first p-type layer PL1, and the p-type electrode PE of the light emitting device LED are larger than areas of the second p-type layer PL2, the second active layer EL2, and the second n-type layer NL2 of the light emitting device. For example, an emission area of the first emission unit EU1 of the light emitting device LED is larger than an emission area of the second emission unit EU2. An example of this can be seen in these figures as the width of the emission area of the first emission unit EU1 is larger than the width of the emission area of the second emission unit EU2. At this time, the first emission unit EU1 and the second emission unit EU2 are connected to the same light emitting device LED to be supplied with a current with the same intensity from the same circuit. Accordingly, when the first emission unit EU1 having a larger emission area emits light, as compared with the second emission unit EU2 which emits light, a current density can be relatively low. Therefore, when the first emission unit EU1 is configured as a main light emitting device, the current density of the light emitting device LED can be further reduced, and heat generation and the life-span of the light emitting device LED can be improved. As such, in the display apparatus according to another embodiment of the present disclosure, when the light emitting device LED normally operates, only the first transistor TR1, among the first transistor TR1 and the second transistor TR2, is driven and the first emission unit EU1 emits light. Accordingly, an emission area of the display apparatus can be increased to reduce a current density of the light emitting device LED.

Hereinafter, a display apparatus according to still another embodiment of the present disclosure will be described in detail.

The display apparatus according to still another embodiment of the present disclosure is configured such that when one emission unit, among the first emission unit EU1 and the second emission unit EU2, is or becomes defective, a transistor electrically connected to the other emission unit among the first and second emission units EU1 and EU2 is driven. Accordingly, the defective light emitting device can be easily repaired.

Specifically, in the display apparatus according to still another embodiment of the present disclosure, in a method for controlling the operation of transistors TR1 and TR2 connected to two emission units EU1 and EU2 (the first emission unit EU1 and the second emission unit EU2) included in one light emitting device LED, the two emission units EU1 and EU2 included in one light emitting device LED can selectively emit light. Therefore, the two emission units EU1 and EU2 included in one light emitting device LED can easily emit light in that when one emission unit is or becomes defective, the other emission unit emits light and thus the defective emission unit can be also easily repaired or be addressed by the other mission unit emitting light.

For example, according to a repair method of a defective emission unit, if a defective emission unit is confirmed by a lighting test, then instead of a transistor connected to the emission unit confirmed to be defective, the defective emission unit can be repaired by driving a transistor connected to the other emission unit laminated together with the emission unit confirmed to be defective. However, the repair method of the defective emission unit is not limited thereto. As described above, the display apparatus according to still another embodiment of the present disclosure is configured such that when one emission unit among the first emission unit EU1 and the second emission unit EU2 is or becomes defective, a transistor electrically connected to the other emission unit among the first and second emission units EU1 and EU2 can be driven to emit light and operate properly. Accordingly, the defective light emitting device can be easily repaired or addressed.

Hereinafter, a display apparatus according to still another embodiment of the present disclosure will be described in detail.

The display apparatus according to still another embodiment of the present disclosure is configured to allow two emission units (the first emission unit EU1 and the second emission unit EU2) included in one light emitting device LED to selectively emit light so that a low luminance mode and a high luminance mode can be selectively implemented.

Specifically, the display apparatus can be driven in a first mode which is driven with a predetermined specific luminance or a second mode which is driven with a higher luminance than the first mode, as needed. For example, the first mode can be a low luminance mode and the second mode can be a high luminance mode.

The display apparatus according to this embodiment of the present disclosure is configured to allow two emission units EU1 and EU2 (the first emission unit EU1 and the second emission unit EU2) included in one light emitting device LED to selectively emit light. Therefore, in the first mode, one of the first transistor TR1 and the second transistor TR2 is driven so that one of the first emission unit EU1 and the second emission unit EU2 can emit light. In the second mode, both the first transistor TR1 and the second transistor TR2 are driven so that both the first emission unit EU1 and the second emission unit EU2 can emit light simultaneously. As such, the first mode which is a low luminance mode and the second mode which is a high luminance mode can be selectively implemented in one light emitting device LED. Accordingly, the display apparatus according to this embodiment of the present disclosure is configured to allow both the first emission unit EU1 and the second emission unit EU2 included in one light emitting device LED to selectively emit light so that a low luminance mode or a high luminance mode can be selectively implemented by the light emitting device LED.

The display apparatus according to still another embodiment of the present disclosure is configured to laminate two emission units (the first emission unit EU1 and the second emission unit EU2) included in one light emitting device LED to emit light by separate transistors TR1 and TR2, respectively. Accordingly, as compared with a light emitting device LED in which only one emission unit is disposed, in the display apparatus according to still another embodiment of the present disclosure, current is divided to flow to the two emission units EU1 and EU2 so that a current required for one emission unit can be reduced.

Figure 6:
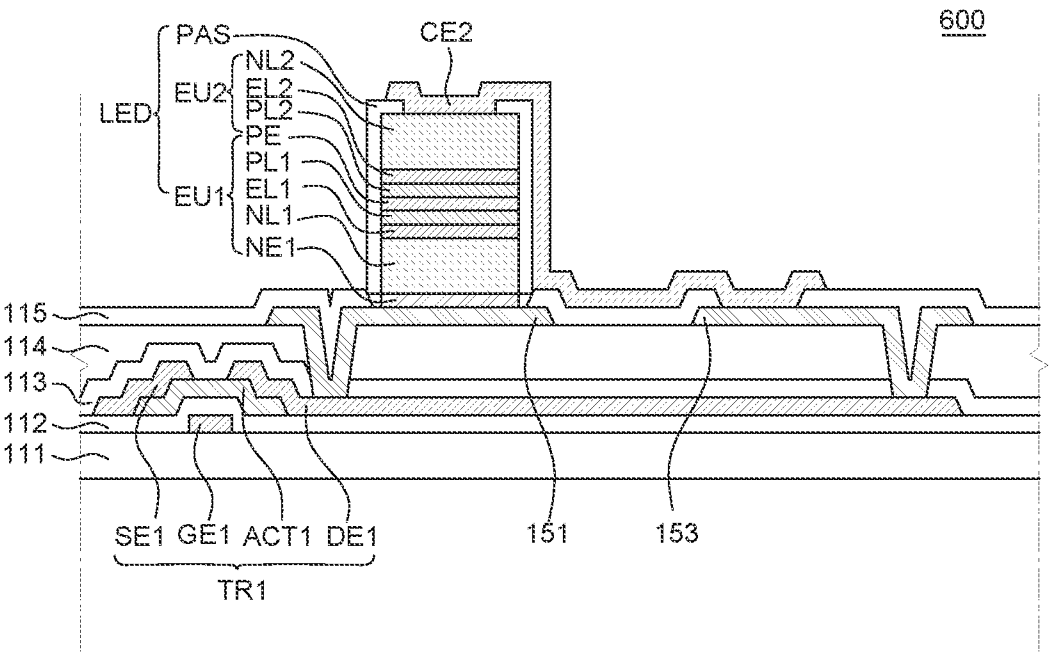
FIG. 6 is a cross-sectional view of a display apparatus according to another embodiment of the present disclosure.

FIG. 6 is a cross-sectional view of a display apparatus according to still another embodiment of the present disclosure. A main difference between a display apparatus 600 of FIG. 6 and the display apparatus 100 of FIGS. 3 to 5B is that the second transistor TR2 is not disposed, and the other configurations are substantially the same, so that a redundancy description will be omitted or briefly provided.

Referring to FIG. 6, a second n-type layer NL2 of the light emitting device LED is connected to the first transistor TR1 through the second connection electrode CE2 and the second individual electrode 153. Specifically, the first individual electrode 151 and the second individual electrode 153 are disposed on the first drain electrode DE1 of the first transistor TR1 to be electrically connected to the first drain electrode DE1, respectively. The first drain electrode DE1 extends between the first and second individual electrodes 151 and 153. The light emitting device LED is disposed on the first individual electrode 151 and the second connection electrode CE2 which is electrically connected to the second n-type layer NL2 of the light emitting device LED is disposed on the second individual electrode 153. For example, the second individual electrode 153 is connected to the first transistor TR1 connected to the first individual electrode 151. Accordingly, two emission units EU1 and EU2 included in one light emitting device LED can be configured to emit light with the same transistor TR1.

According to this another embodiment of the present disclosure, the two emission units EU1 and EU2 included in one light emitting device LED are configured to emit light with the same transistor TR1 so that the heat generation characteristic and the life-span reliability of the light emitting device LED are improved. By doing this, the low power display apparatus 600 can be provided.

Specifically, in the display apparatus 600 according to the embodiment of the present disclosure, two emission units EU1 and EU2 included in one light emitting device LED are configured to emit light with the same transistor TR1. For example, when the transistor TR1 connected to the light emitting device LED is driven, the two emission units EU1 and EU2 included in the light emitting device LED can simultaneously emit light. At this time, current applied from one transistor TR1 can be divided to flow to the two emission units EU1 and EU2. Accordingly, the emission area for the same current is increased so that the current density of the one light emitting device LED can be reduced, which can improve the heat generation characteristic and the life-span reliability of the light emitting device LED.

In the meantime, in the display apparatus 600, the two emission units EU1 and EU2 included in the one light emitting device LED are connected to the same transistor TR1 so that a separate transistor for driving the two emission units EU1 and EU2 is not needed and may not be manufactured. Therefore, a cost for manufacturing the transistor and the display apparatus and the process can be reduced. Accordingly, process optimization is possible.

Although an example in which the display apparatus according to embodiments of the present disclosure is supplied with power through the first individual electrode 151, the common electrode 152, the second individual electrode 153, the first connection electrode CE1 and the second connection electrode CE2 has been described above with reference to FIG. 5A, FIG. 5B and FIG. 6, the present disclosure is not limited thereto, and other ways can be used to supply power to the display apparatus according to actual needs.

The embodiments of the present disclosure can also be described as follows:

According to an aspect of the present disclosure, a light emitting device includes a first n-type electrode; a first n-type layer disposed on the first n-type electrode; a first active layer disposed on the first n-type layer; a first p-type layer disposed on the first active layer; a p-type electrode disposed on the first p-type layer; a second p-type layer disposed on a partial area of the p-type electrode; a second active layer disposed on the second p-type layer; and a second n-type layer disposed on the second active layer.

Areas of the first n-type electrode, the first n-type layer, the first active layer, the first p-type layer, and the p-type electrode can be larger than areas of the second p-type layer, the second active layer, and the second n-type layer.

The p-type electrode can be a transparent electrode.

The first active layer and the second active layer can emit light of the same color.

A dominant wavelength of light emitted from the first active layer is different from a dominant wavelength of light emitted from the second active layer.

The light emitting device can further comprise a passivation layer disposed so as to enclose the first n-type layer, the first active layer, the first p-type layer, the p-type electrode, the second p-type layer, the second active layer, and the second n-type layer.

The passivation layer can open a part of the p-type electrode and a part of the second n-type layer.

According to another aspect of the present disclosure, a display apparatus includes a substrate in which a plurality of pixels including a plurality of sub pixels is defined; a first transistor disposed in each of the plurality of sub pixels on the substrate; a planarization layer which is disposed on the first transistor; a first individual electrode which is disposed on the planarization layer and is connected to the first transistor; a light emitting device disposed on the first individual electrode; a second individual electrode and a common electrode disposed on the planarization layer; a first connection electrode which connects the common electrode and the p-type electrode of the light emitting device; and a second connection electrode which connects the second individual electrode and the second n-type layer of the light emitting device.

The first individual electrode and the second individual electrode can be cathodes and the common electrode can be an anode.

A high potential voltage can be transmitted to the common electrode.

The display apparatus can further comprise a second transistor disposed in each of the plurality of sub pixels on the substrate.

The second individual electrode can be connected to the second transistor.

The light emitting device can include a first emission unit and a second emission unit.

The first emission unit can include a first n-type electrode; a first n-type layer disposed on the first n-type electrode; a first active layer disposed on the first n-type layer; a first p-type layer disposed on the first active layer; and a p-type electrode disposed on the first p-type layer.

The second emission unit can include the p-type electrode; a second p-type layer disposed on a partial area of the p-type electrode; a second active layer disposed on the second p-type layer; and a second n-type layer disposed on the second active layer.

When one of the first emission unit and the second emission unit is defective, a transistor which is electrically connected to the other emission unit can be driven.

Only the first transistor between the first transistor and the second transistor is driven so that the first emission unit can emit light.

Only the second transistor between the first transistor and the second transistor is driven so that the second emission unit can emit light.

The display apparatus can be driven in a first mode or a second mode which has a higher luminance than the first mode.

In the first mode, one of the first transistor and the second transistor can be driven so that one of the first emission unit and the second emission unit emits light.

In the second mode, both of the first transistor and the second transistor can be driven so that both of the first emission unit and the second emission unit emit light.

The second individual electrode can be connected to the first transistor to which the first individual electrode is connected.

The light emitting devices disposed in the plurality of sub pixels can be connected to the same common electrode, and can be connected to different first individual electrodes and different second individual electrodes from each other.

According to still another aspect of the present disclosure, a display apparatus includes a plurality of sub-pixels, each sub-pixel comprising: a first emission unit including a p-type electrode, a first p-type layer, a first active layer, a first n-type layer and a first n-type electrode disposed in sequence from top to bottom; a second emission unit disposed on the first emission unit and including a second n-type layer, a second active layer, a second p-type layer, and the p-type electrode disposed in sequence from top to bottom; and a first transistor for driving at least one of the first emission unit and the second emission unit, wherein, an emission area of the second emission unit is smaller than an emission area of the first emission unit.

Although the embodiments of the present disclosure have been described in detail with reference to the accompanying drawings, the present disclosure is not limited thereto and can be embodied in many different forms without departing from the technical concept of the present disclosure. Therefore, the embodiments of the present disclosure are provided for illustrative purposes only but not intended to limit the technical concept of the present disclosure. The scope of the technical concept of the present disclosure is not limited thereto. Therefore, it should be understood that the above-described embodiments are illustrative in all aspects and do not limit the present disclosure. The protective scope of the present disclosure should be construed based on the following claims, and all the technical concepts in the equivalent scope thereof should be construed as falling within the scope of the present disclosure.

What is claimed is:

1. A light emitting device, comprising:
- an n-type electrode;
- a first n-type layer disposed on the n-type electrode;
- a first active layer disposed on the first n-type layer;
- a first p-type layer disposed on the first active layer;
- a p-type electrode disposed on the first p-type layer;
- a second p-type layer disposed on a partial area of the p-type electrode;
- a second active layer disposed on the second p-type layer; and
- a second n-type layer disposed on the second active layer,
- wherein the light emitting device includes a first emission unit and a second emission unit,
- wherein the first emission unit includes the n-type electrode, the first n-type layer disposed on the n-type electrode, the first active layer disposed on the first n-type layer, the first p-type layer disposed on the first active layer, and the p-type electrode disposed on the first p-type layer,
- wherein the second emission unit includes the p-type electrode, the second p-type layer disposed on the partial area of the p-type electrode, the second active layer disposed on the second p-type layer, and the second n-type layer disposed on the second active layer,
- wherein the light emitting device is configured to be disposed on a first individual electrode of a display apparatus, and
- wherein a first connection electrode of the display apparatus is configured to connect a common electrode of the display apparatus to the p-type electrode of the light emitting device and a second connection electrode of the display apparatus is configured to connect a second individual electrode of the display apparatus to the second n-type layer of the light emitting device.

2. The light emitting device according to claim 1, wherein an area of at least one of the n-type electrode, the first n-type layer, the first active layer, the first p-type layer, and the p-type electrode is larger than an area of each of at least one of the second p-type layer, the second active layer, and the second n-type layer.

3. The light emitting device according to claim 1, wherein the p-type electrode is a transparent electrode.

4. The light emitting device according to claim 1, wherein the first active layer and the second active layer emit light of a same color.

5. The light emitting device according to claim 4, wherein a dominant wavelength of light emitted from the first active layer is different from a dominant wavelength of light emitted from the second active layer.

6. The light emitting device according to claim 1, further comprising:
- a passivation layer disposed to surround the first n-type layer, the first active layer, the first p-type layer, the p-type electrode, the second p-type layer, the second active layer, and the second n-type layer,
- wherein the passivation layer exposes a part of the p-type electrode and a part of the second n-type layer.

7. A display apparatus, comprising:
- a substrate in which a plurality of pixels including a plurality of sub pixels are defined;
- a first transistor disposed in each of the plurality of sub pixels on the substrate;
- a planarization layer disposed on the first transistor;
- a first individual electrode disposed on the planarization layer and connected to the first transistor;

a light emitting device disposed on the first individual electrode, the light emitting device including an n-type electrode, a first n-type layer disposed on the n-type electrode, a first active layer disposed on the first n-type layer, a first p-type layer disposed on the first active layer, a p-type electrode disposed on the first p-type layer, a second p-type layer disposed on a partial area of the p-type electrode, a second active layer disposed on the second p-type layer, and a second n-type layer disposed on the second active layer;

a second individual electrode and a common electrode disposed on the planarization layer;

a first connection electrode connecting the common electrode to the p-type electrode of the light emitting device; and a second connection electrode connecting the second individual electrode to the second n-type layer of the light emitting device.

8. The display apparatus according to claim 7, wherein the first individual electrode and the second individual electrode are cathodes, and the common electrode is an anode.

9. The display apparatus according to claim 8, wherein a high potential voltage is transmitted to the common electrode.

10. The display apparatus according to claim 7, further comprising:

a second transistor disposed in each of the plurality of sub pixels on the substrate, wherein the second individual electrode is connected to the second transistor.

11. The display apparatus according to claim 10, wherein the light emitting device includes a first emission unit and a second emission unit, the first emission unit includes the n-type electrode, the first n-type layer disposed on the n-type electrode, the first active layer disposed on the first n-type layer, the first p-type layer disposed on the first active layer, and the p-type electrode disposed on the first p-type layer, and the second emission unit includes the p-type electrode, the second p-type layer disposed on the partial area of the p-type electrode, the second active layer disposed on the second p-type layer, and the second n-type layer disposed on the second active layer.

12. The display apparatus according to claim 11, wherein when one of the first emission unit and the second emission unit becomes defective or is not operating properly, a transistor among the first and second transistors, which is electrically connected to the other emission unit among the first and second emission units, is driven.

13. The display apparatus according to claim 11, wherein in one mode of the display apparatus, only the first transistor among the first transistor and the second transistor is driven so that the first emission unit emits light.

14. The display apparatus according to claim 11, wherein in one mode of the display apparatus, only the second transistor among the first transistor and the second transistor is driven so that the second emission unit emits light.

15. The display apparatus according to claim 11, wherein the display apparatus is driven in a first mode or a second mode which provides a higher luminance than the first mode, in the first mode, one of the first transistor and the second transistor is driven so that one of the first emission unit and the second emission unit emits light, and in the second mode, both the first transistor and the second transistor are driven so that both the first emission unit and the second emission unit emit light.

16. The display apparatus according to claim 11, wherein the second individual electrode is connected to the first transistor to which the first individual electrode is connected.

17. The display apparatus according to claim 11, wherein a plurality of light emitting devices disposed in a plurality of sub pixels of one pixel are connected to the same common electrode, and are connected to different first individual electrodes and different second individual electrodes.

18. A display apparatus comprising:

a plurality of sub-pixels, each sub-pixel including:

a first emission unit including a p-type electrode, a first p-type layer, a first active layer, a first n-type layer and an n-type electrode disposed on a substrate;

a second emission unit stacked on the first emission unit, and including a second n-type layer, a second active layer, a second p-type layer, and the p-type electrode; and a first transistor configured to drive at least one of the first emission unit and the second emission unit, wherein an emission area of the second emission unit is smaller than an emission area of the first emission unit, and wherein:

the first transistor is electrically connected to the first n-type layer through a first individual electrode, a second transistor is electrically connected to the second n-type layer through a second individual electrode and a second connection electrode, the p-type electrode is electrically connected to a high potential power line through a first connection electrode and a common electrode, and the first individual electrode, the second individual electrode and the common electrode are disposed on a same layer.

19. The display apparatus according to claim 18, wherein each sub-pixel further includes the second transistor configured to drive the second emission unit, so that the first transistor is only used to drive the first emission unit.

20. The display apparatus according to claim 18, wherein in a first mode, both the first and second emission units are driven to emit light simultaneously, while in a second mode different from the first mode, only one emission unit among the first and second emission units is driven to emit light.

21. The display apparatus according to claim 18, wherein the first and second emission units are integrally formed as one light emitting device provided in each sub-pixel, and wherein the first emission unit functions as a main emission device of the display apparatus, while the second emission unit functions as a redundancy emission device of the display apparatus.

* * * * *